(12) United States Patent
Zhu et al.

(10) Patent No.: US 8,501,020 B2
(45) Date of Patent: *Aug. 6, 2013

(54) METHOD FOR MAKING THREE-DIMENSIONAL NANO-STRUCTURE ARRAY

(75) Inventors: Zhen-Dong Zhu, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 270 days.

This patent is subject to a terminal disclaimer.

(21) Appl. No.: 12/969,998

(22) Filed: Dec. 16, 2010

(65) Prior Publication Data

US 2011/0294295 A1 Dec. 1, 2011

(30) Foreign Application Priority Data

May 27, 2010 (CN) .......................... 2010 1 0184792

(51) Int. Cl.
*B44C 1/22* (2006.01)
*B82Y 40/00* (2011.01)

(52) U.S. Cl.
USPC .......... 216/11; 216/41; 216/42; 216/49; 216/51; 216/67; 216/69; 216/74; 216/75; 216/77; 216/79; 216/80; 977/888; 977/892

(58) Field of Classification Search
None
See application file for complete search history.

(56) References Cited

U.S. PATENT DOCUMENTS

| | | | |
|---|---|---|---|
| 4,407,695 A * | 10/1983 | Deckman et al. | 216/42 |
| 7,046,441 B2 | 5/2006 | Huang et al. | |
| 7,483,130 B2 | 1/2009 | Baumberg et al. | |
| 7,700,520 B2 * | 4/2010 | Chien et al. | 502/334 |
| 2006/0002656 A1 | 1/2006 | Cowan et al. | |
| 2006/0228722 A1 * | 10/2006 | Kim et al. | 435/6 |
| 2007/0177647 A1 | 8/2007 | Noda et al. | |
| 2007/0184204 A1 * | 8/2007 | Balagopal et al. | 427/419.2 |
| 2007/0284570 A1 * | 12/2007 | Sydorenko et al. | 257/40 |
| 2008/0047929 A1 | 2/2008 | Wang et al. | |
| 2010/0087723 A1 * | 4/2010 | Van Duyne et al. | 600/365 |
| 2010/0221866 A1 * | 9/2010 | Graham et al. | 438/73 |
| 2010/0244079 A1 | 9/2010 | Orita | |
| 2011/0195201 A1 * | 8/2011 | Zhu et al. | 427/551 |
| 2012/0152353 A1 * | 6/2012 | Zhu et al. | 136/261 |
| 2012/0170033 A1 * | 7/2012 | Zhu et al. | 356/301 |

FOREIGN PATENT DOCUMENTS

| | | |
|---|---|---|
| CN | 1606137 | 4/2005 |
| CN | 1872659 | 12/2006 |
| CN | 101382734 | 3/2009 |
| CN | 101574670 | 11/2009 |
| CN | 101693519 | 4/2010 |

(Continued)

OTHER PUBLICATIONS

English machine translation by KIPO of KR 10-2009-0098935, Sep. 18, 2009.*

*Primary Examiner* — Anita Alanko
(74) *Attorney, Agent, or Firm* — Altis Law Group, Inc.

(57) ABSTRACT

A method for making a three-dimensional nano-structure array includes following steps. First, a substrate is provided. Next, a mask is formed on the substrate. The mask is a monolayer nanosphere array or a film defining a number of holes arranged in an array. The mask is then tailored and simultaneously the substrate is etched by the mask. Lastly, the mask is removed.

16 Claims, 10 Drawing Sheets

FOREIGN PATENT DOCUMENTS

| | | |
|---|---|---|
| JP | 2003-69075 | 3/2003 |
| JP | 2008-91880 | 4/2008 |
| JP | 2009-16879 | 1/2009 |
| KR | 20090098935 | 9/2009 |
| TW | I230834 | 4/2005 |
| TW | 200536775 | 11/2005 |

\* cited by examiner

METHOD FOR MAKING THREE-DIMENSIONAL NANO-STRUCTURE ARRAY

CROSS-REFERENCE TO RELATED APPLICATIONS

This application claims all benefits accruing under 35 U.S.C. §119 from China Patent Application No. 201010184792.4, filed on May 27, 2010 in the China Intellectual Property Office, disclosure of which is incorporated herein by reference. This application is related to applications entitled, "THREE-DIMENSIONAL NANO-STRUCTURE ARRAY", filed as a U.S. application Ser. No. 12/970,085 on Dec. 16, 2010; and "LIGHT EMITTING DIODE", filed as U.S. application Ser. No. 12/970,234 on Dec. 16, 2010.

BACKGROUND

1. Technical Field

The present disclosure relates to a three-dimensional nano-structure array and method for making the same.

2. Description of Related Art

Nano materials are widely used and studied due to their novel physical or chemical properties.

However, the nano materials are usually one-dimensional such as carbon nanotube, or two-dimensional such as graphene. A three-dimensional nano-structure, especially a three-dimensional nano-structure array, is difficult to fabricate. A method for making the three-dimensional nano-structure array usually includes lithographing. However, the cost of the three-dimensional nano-structure array is high because the lithography system is expensive, and the process of making the three-dimensional nano-structure array is complicated.

What is needed, therefore, is to provide a three-dimensional nano-structure array and a low-cost and simple method for making the same.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present three-dimensional nano-structure array and method for making the same.

Figure 1:
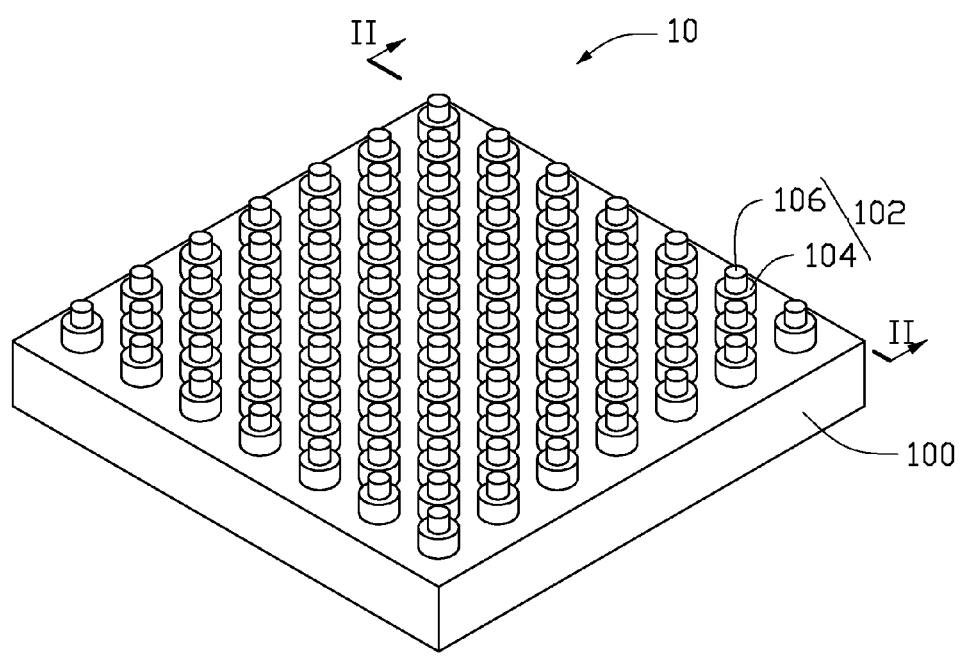
FIG. 1 is a schematic view of one embodiment of a three-dimensional nano-structure array.
Figure 2:
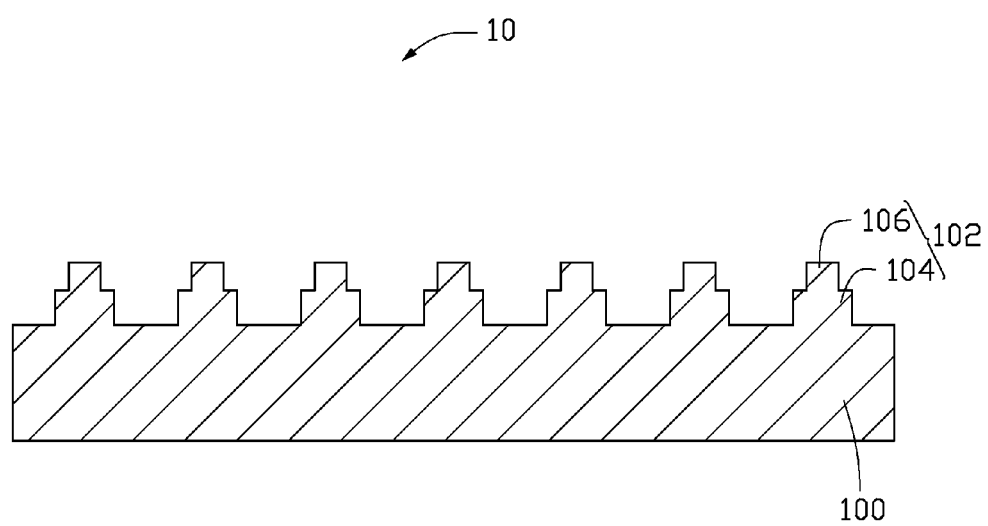
FIG. 2 is a schematic, cross-sectional view, along a line II-II of FIG. 1.

Referring to FIGS. 1 to 2, a three-dimensional nano-structure array 10 of one embodiment includes a substrate 100 and a number of three-dimensional nano-structures 102 located on at least one surface of the substrate 100. Each of the three-dimensional nano-structures 102 has a stepped structure.

The substrate 100 can be an insulative substrate 100 or a semiconductor substrate 100. The substrate 100 can be made of a material such as glass, quartz, silicon (Si), silicon dioxide ($SiO_2$), silicon nitride ($Si_3N_4$), gallium nitride (GaN), gallium arsenide (GaAs), alumina ($Al_2O_3$), or magnesia (MgO). A size and a thickness of the substrate 100 can be determined according to need. In one embodiment, the substrate 100 is a square sapphire substrate with a GaN semiconductor epilayer grown thereon. A side length of the substrate 100 is about 2 centimeters.

The three-dimensional nano-structures 102 can be a stepped bulge. The stepped bulge is a stepped body protruding out from the surface of the substrate 100. The stepped bulge can be a multi-layer structure such as a multi-layer frustum of a prism, a multi-layer frustum of a cone, or a multi-layer cylinder. In one embodiment, the three-dimensional nano-structure 102 is a stepped cylindrical structure. The size of the three-dimensional nano-structure 102 is less than or equal to 1000 nanometers, namely, the length, the width, and the height are less than or equal to 1000 nanometers. In one embodiment, the length, the width, and the height of the three-dimensional nano-structure 102 are in a range from about 10 nanometers to about 500 nanometers.

In one embodiment, the three-dimensional nano-structure 102 is a two-layer cylindrical structure including a first cylinder 104 and a second cylinder 106 extending from a top of the first cylinder 104. The diameter of the second cylinder 106 is less than the diameter of first cylinder 104 to form the stepped structure. The first cylinder 104 is located on the surface of the substrate 100. The first cylinder 104 extends substantially perpendicularly and upwardly from the surface of the substrate 100. The second cylinder 106 extends substantially perpendicularly and upwardly from a top surface of the first cylinder 104. The second cylinder 106 and the first cylinder 104 can be coaxial. The second cylinder 106 and the first cylinder 104 can be an integral structure, namely the second cylinder 106 is a protruding body of the first cylinder 104. The two adjacent three-dimensional nano-structures 102 are substantially equidistantly arranged.

In one embodiment, the diameter of the first cylinder 104 can be in a range from about 30 nanometers to about 1000 nanometers. The height of the first cylinder 104 can be in a range from about 50 nanometers to about 1000 nanometers. The diameter of the second cylinder 106 can be in a range from about 10 nanometers to about 500 nanometers. The height of the second cylinder 106 can be in a range from about 20 nanometers to about 500 nanometers. The distance between two adjacent first cylinders 104 can be in a range from about 10 nanometers to about 1000 nanometers.

In one embodiment, the diameter of the first cylinder 104 can be in a range from about 50 nanometers to about 200 nanometers. The height of the first cylinder 104 can be in a range from about 100 nanometers to about 500 nanometers. The diameter of the second cylinder 106 can be in a range from about 20 nanometers to about 200 nanometers. The height of the second cylinder 106 can be in a range from about 100 nanometers to about 300 nanometers. The distance between the two adjacent first cylinders 104 can be in a range from about 10 nanometers to about 30 nanometers. Thus, both the first cylinders 104 and the second cylinders 106 can be considered as a photonic band gap to contribute to the light extraction when the three-dimensional nano-structure array 10 is used in a light-emitting diode.

In one embodiment, the diameter of the first cylinder 104 is about 380 nanometers, the height of the first cylinder 104 is about 105 nanometers, the diameter of the second cylinder 106 is about 280 nanometers, the height of the second cylinder 106 is about 55 nanometers, and the distance between two adjacent first cylinders 104 is about 30 nanometers.

Figure 3:
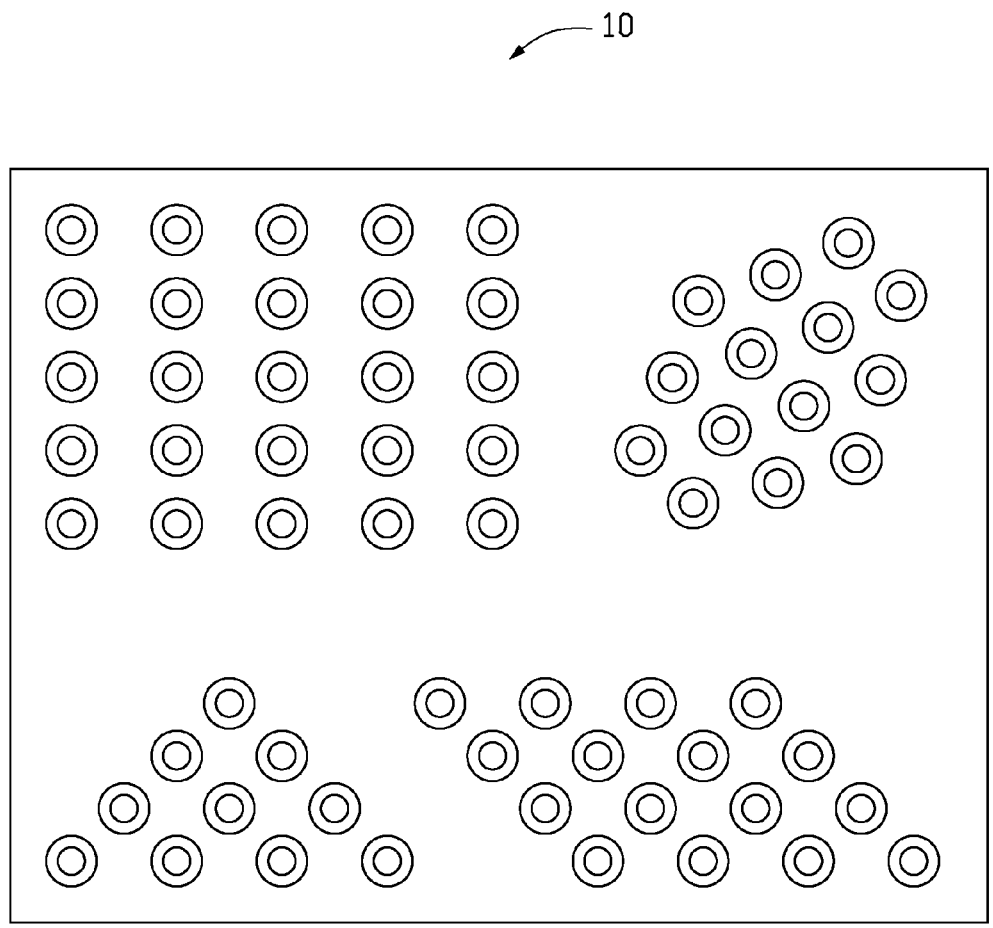
FIG. 3 is a schematic view of one embodiment of a three-dimensional nano-structure array forming a pattern group.

The material of the three-dimensional nano-structure 102 can be the same as the material of the substrate 100 so that the three-dimensional nano-structure 102 and the substrate 100 form an integral structure. The three-dimensional nano-structures 102 can be arranged in the form of an array. The three-dimensional nano-structures 102 in the array can be hexagonally arranged, squarely arranged, or concentrically arranged. The three-dimensional nano-structures 102 can be arranged to form a single pattern or a pattern group. The single pattern can be a triangle, parallelogram, diamond, square, trapezoid, rectangle, or circle. As shown in FIG. 3, the pattern group can include the same or different single patterns. In one embodiment, the three-dimensional nano-structures 102 are hexagonally arranged.

Because each of the three-dimensional nano-structures 102 has a stepped structure, the three-dimensional nano-structure array 10 includes at least two layers of three-dimensional nano-structures arranged in the form of an array. The three-dimensional nano-structure array 10 can be widely used in nano integrated circuits, light-emitting diodes, solar cells, or nano optical components such as plasmonic.

Figure 4:
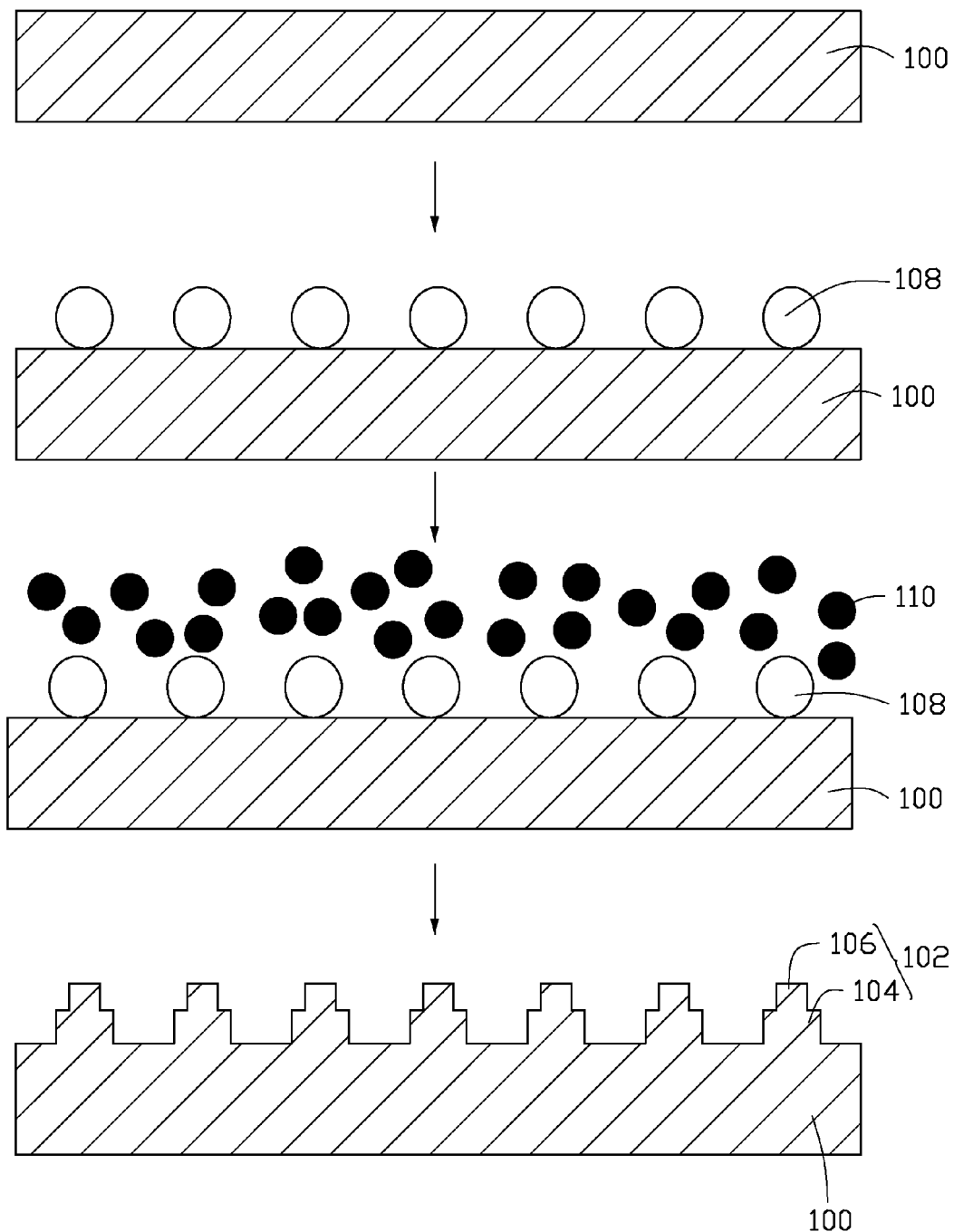
FIG. 4 shows a process of one embodiment of a method for making a three-dimensional nano-structure array.

Referring to FIG. 4, a method for making a three-dimensional nano-structure array 10 of one embodiment includes the following steps of:

step (a), providing an substrate 100;

step (b), forming a monolayer nanosphere array 108 on a surface of the substrate 100;

step (c), simultaneously tailoring the monolayer nanosphere array 108 and etching the substrate 100 by the monolayer nanosphere array 108; and step (d), removing the monolayer nanosphere array 108.

In step (a), the substrate 100 can be made of a material such as glass, quartz, silicon (Si), silicon dioxide ($SiO_2$), silicon nitride ($Si_3N_4$), gallium nitride (GaN), gallium arsenide (GaAs), alumina ($Al_2O_3$), or magnesia (MgO). In one embodiment, a GaN epilayer is grown on a c-face of a sapphire substrate by metal-organic chemical vapor deposition (MOCVD) to form the substrate 100. The GaN epilayer can be n-type or p-type doped.

An optional step (e) of hydrophilicly treating the substrate 100 can be performed after step (a) and before step (b).

In step (e), if the substrate 100 is made of Si or $SiO_2$, the step (e) can include the following substeps:

step (e1): cleaning the substrate 100;

step (e2): soaking the substrate 100 in a hydrophilicly treating solution; and step (e3): rinsing and drying the substrate 100.

In step (e1), the cleaning process can be a standard cleaning process used in room cleaning.

In step (e2), the hydrophilicly treating solution can be a mixture of $NH_3$, $H_2O$, $H_2O_2$, and $H_2O$ at a temperature in a range from about 30° C. to about 100° C. The soaking time is in a range from about 30 minutes to about 60 minutes. The hydrophilicly treating solution can be a mixture of $NH_3.H_2O$: $H_2O_2$:$H_2O$ at about 0.5-1:1:5. In one embodiment, the hydrophilicly treating solution is $NH_3.H_2O$:$H_2O_2$:$H_2O$ at about 0.6:1:5 with a temperature in a range from about 70° C. to about 80° C., and the soaking time of about 40 minutes.

In step (e3), the substrate 100 can be rinsed in deionized water for about 2 times to about 3 times. The substrate 100 can be dried by nitrogen gas blowing.

In step (e), if the substrate 100 is made of GaN, the step (e) may include the following steps of:

step (e1a): cleaning the substrate 100; and step (e2a): treating the substrate 100 in microwave plasma.

Step (e1a) is the same as the step (e1) described above. In step (e2a), the substrate 100 is put into a microwave plasma system and is treated by diffusing the microwave plasma on the surface of the substrate 100. The microwave plasma system can be an oxygen plasma system to produce oxygen plasma, a chlorine plasma system to produce chlorine plasma, or an argon plasma system to produce argon plasma.

The power of the oxygen plasma system can be in a range from about 10 Watts to about 150 Watts. The input flow rate of the oxygen plasma can be about 10 standard cubic centimeters per minute (scc/m). The working pressure of the oxygen plasma can be about 2 Pa. The treatment time in the oxygen plasma can be in a range from about 1 second to about 30 seconds. In one embodiment, the substrate 100 is a polyethylene film, and the treatment time in the oxygen plasma is in a range from about 5 seconds to about 10 seconds.

The power of the chlorine plasma system can be about 50 Watts. The input flow rate of the chlorine plasma can be about 26 scc/m. The working pressure of the chlorine plasma can be in a range from about 2 Pa to about 10 Pa. The treatment time in the chlorine plasma can be in a range from about 3 seconds to about 5 seconds.

The power of the argon plasma system can be about 50 Watts. The input flow rate of the chlorine plasma can be about 4 scc/m. The working pressure of the chlorine plasma can be in a range from about 2 Pa to about 10 Pa. The treatment time in the chlorine plasma can be in a range from about 10 seconds to about 30 seconds.

Step (b) can include the substeps of:

step (b1), preparing a nanosphere solution;

step (b2), forming a monolayer nanosphere solution on the substrate 100; and step (b3), drying the monolayer nanosphere solution.

In step (b1), the diameter of the nanosphere can be in range from about 60 nanometers to about 500 nanometers, such as 100 nanometers, 200 nanometers, 300 nanometers, or 400 nanometers. The material of the nanosphere can be polymer or silicon. The polymer can be polymethyl methacrylate (PMMA) or polystyrene (PS). In one embodiment, a PS nanosphere solution can be synthesized by emulsion polymerization.

In step (b2), the monolayer nanosphere solution can be formed on the substrate 100 by dipping.

The method of dipping can include the substeps of:

step (b21), diluting the nanosphere solution;

step (b22), inserting the substrate 100 into the diluted nanosphere solution; and step (b23), drawing the substrate 100 out of the diluted nanosphere solution.

In step (b21), the nanosphere solution can be diluted by water or ethanol. In one embodiment, about 3 microlitres to about 5 microlitres PS nanosphere solution of about 0.01 wt. % to about 10 wt. % is mixed with 150 milliliters water, and about 1 microlitre to about 5 microlitres dodecylsodiumsulfate (SDS) of about 2 wt. % to obtain a mixture. The mixture can be kept for about 30 minutes to about 60 minutes. In addition, about 1 microlitre to about 3 microlitres SDS of about 4 wt. % can be added in the mixture to adjust the surface tension of the PS nanospheres.

In step (b22) and step (b23), the substrate 100 is inserted into and is drawn out of the diluted nanosphere solution slowly and obliquely. An angle between the surface of the substrate 100 and the level can be in a range from about 5 degrees to about 15 degrees. The speed of inserting and drawing the substrate can be in a range from about 3 millimeters per hour to about 10 millimeters per hour. In one embodiment, the angle between the surface of the substrate 100 and the level is about 9 degrees, and the velocity of inserting and drawing the substrate is about 5 millimeters per hour.

In step (b2), the monolayer nanosphere solution can be formed on the substrate 100 by spin coating. The method of spin-coating includes the substeps of:

step (b21a), diluting the nanosphere solution;

step (b22a), dripping some diluted nanosphere solution on the surface of the substrate 100;

step (b23a), spinning the substrate 100 at a speed from about 400 revolutions per minute to about 500 revolutions per minute for about 5 seconds to about 30 seconds;

step (b24a), increasing the spinning speed of the substrate 100 to a range from about 800 revolutions per minute to about 1000 revolutions per minute and maintaining it for about 30 seconds to about 2 minutes; and step (b25a): increasing the spinning speed of the substrate 100 to a range from about 1400 revolutions per minute to about 1500 revolutions per minute and maintaining it for about 10 seconds to about 20 seconds.

In step (b21a), about 10 wt. % of the PS nanosphere solution can be diluted by mixing with a diluting agent at a volume ratio of about 1:1. The diluting agent can be a mixture of SDS and ethanol with a volume ratio of about 1:4000.

In step (b22a), the nanosphere solution of about 3 microlitres to about 4 microlitres is entirely dispersed onto the surface of the substrate 100.

In steps (b23a) to step (b25a), a close-packed monolayer nanosphere solution is generated from the center to the edge of the substrate 100.

Figure 5:
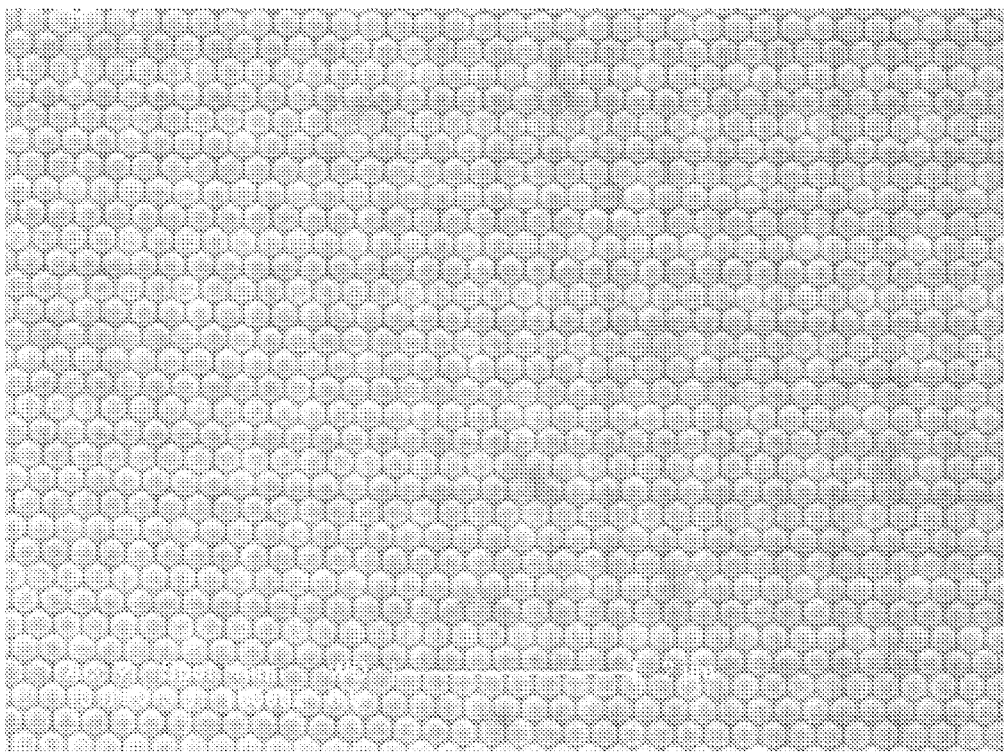
FIG. 5 is a Scanning Electron Microscope (SEM) image of a hexagonally close-packed monolayer nanosphere array of one embodiment of a method for making a three-dimensional nano-structure array.
Figure 6:
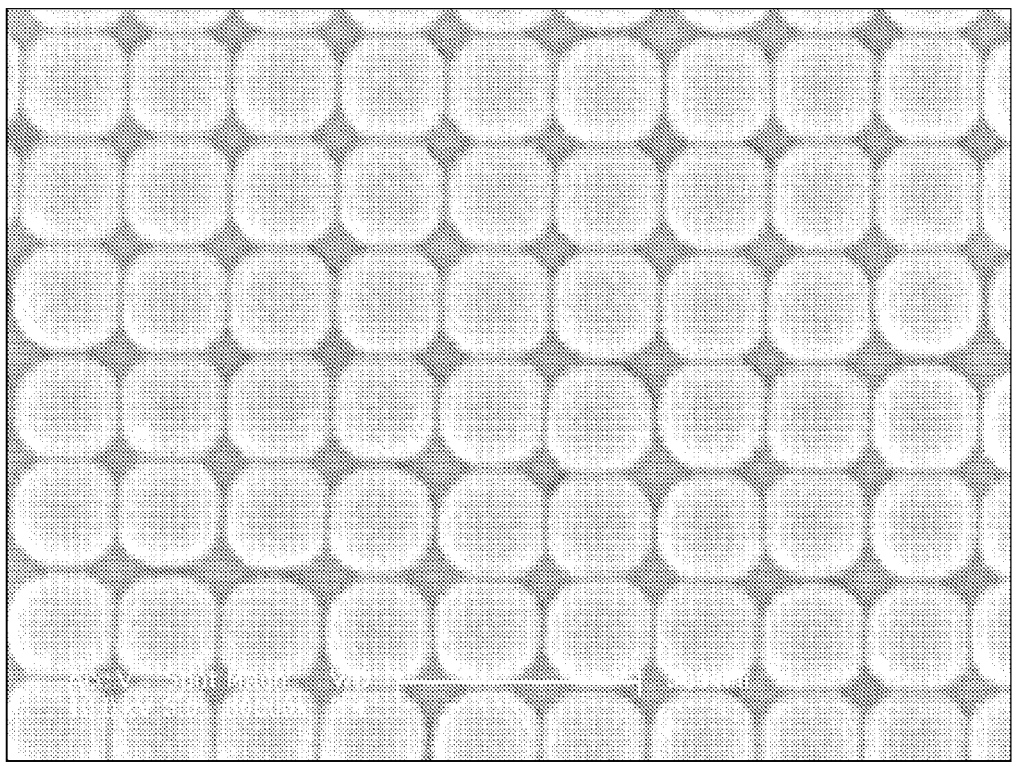
FIG. 6 is a SEM of a squarely close-packed monolayer nanosphere array of one embodiment of a method for making a three-dimensional nano-structure array.

In step (b3), the monolayer nanosphere array 108 can be obtained. The monolayer nanosphere array 108 includes a number of monolayer nanospheres hexagonally close-packed, squarely close-packed, or concentrically close-packed. As shown in FIG. 5, in one embodiment, the monolayer nanospheres are hexagonally close-packed. As shown in FIG. 6, in one embodiment, the monolayer nanospheres are squarely close-packed.

An optional step (b4) of baking the monolayer nanosphere array 108 can be performed after step (b3). The baking temperature can range from about 50° C. to about 100° C. and the baking time can range from about 1 minute to about 5 minutes.

Furthermore, an optional step (f) of a secondary hydrophilic treatment can be performed after step (e) and before step (b). In step (f), the substrate 100 is soaked in about 1 wt. % to about 5 wt. % of SDS solution for about 2 hours to about 24 hours to obtain a hydrophilic surface. In one embodiment, the substrate 100 is soaked in about 2 wt. % of SDS solution for about 10 hours. As shown in FIG. 6, squarely close-packed monolayer nanospheres can be obtained in step (b) when the step (f) is performed. In the squarely close-packed monolayer nanospheres, the nanospheres in the same row or same column are arranged coaxially.

In step (c), the tailoring and etching can be performed in a reactive atmosphere 110. The monolayer nanosphere array 108 can be used as a mask.

In one embodiment, step (c) can be carried out in a microwave plasma system at Reaction-Ion-Etching mode. The microwave plasma system produces the reactive atmosphere 110. The reactive atmosphere 110 with lower ions energy diffuses to a surface of the monolayer nanosphere array 108. The reactive atmosphere 110 can tailor the monolayer nanosphere array 108 and simultaneously etch the substrate 100 by the monolayer nanosphere array 108, which is used as a mask. The nanospheres become smaller and the gap between the adjacent nanospheres becomes greater during the process. As the gap between the adjacent nanospheres increases, more portions of the substrate 100 can be etched. Thus, the three-dimensional nano-structures 102 with the stepped structure are obtained.

In one embodiment, the reactive atmosphere 110 consists of chlorine gas ($Cl_2$), argon gas (Ar), and oxygen gas ($O_2$). The input flow rate of the chlorine gas can be in a range from about 10 scc/m to about 60 scc/m. The input flow rate of the argon gas can be in a range from about 4 scc/m to about 20 scc/m. The input flow rate of the oxygen gas can be in a range from about 4 scc/m to about 20 scc/m. The power of the plasma system can be in a range from about 40 Watts to about 70 Watts. The working pressure of the reactive atmosphere 110 can be a range from about 2 Pa to about 10 Pa. The tailoring and etching time in the reactive atmosphere 110 can be in a range from about 1 minute to about 2.5 minutes. The ratio between the power of the plasma system and the working pressure of the reactive atmosphere 110 can be less than 20:1. In one embodiment, the ratio between the power of the plasma system and the working pressure of the reactive atmosphere 110 can be less than 10:1. The distance between the two adjacent three-dimensional nano-structures 102 can be determined by the tailoring and etching time.

Furthermore, an adjusting gas can be added into the reactive atmosphere 110 to adjust the tailoring and etching time. The adjusting gas can be boron trichloride ($BCl_3$), carbon tetrafluoride ($CF_4$), sulfur hexafluoride ($SF_6$), trifluoromethane ($CHF_3$), or combination thereof. The input flow rate of the adjusting gas can be in a range from about 20 scc/m to about 40 scc/m.

Figure 7:
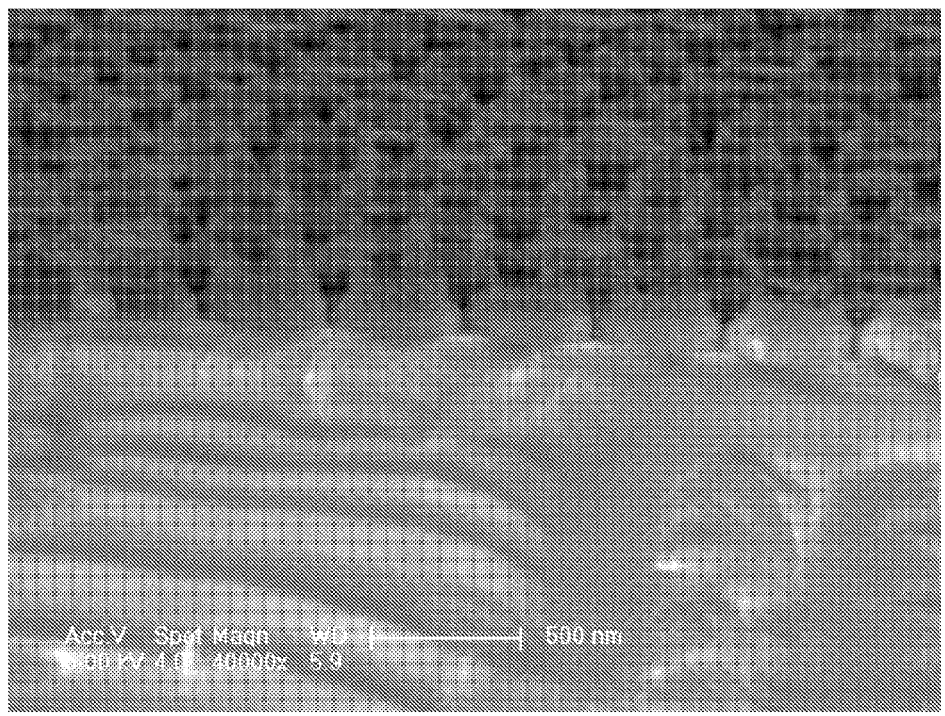
FIG. 7 is a SEM of one embodiment of a three-dimensional nano-structure array.

In step (e), the monolayer nanosphere array 108 can be removed by dissolving in a stripping agent such as tetrahydrofuran (THF), acetone, butanone, cyclohexane, hexane, methanol, or ethanol. The monolayer nanosphere array 108 can also be removed by peeling with an adhesive tape. In one embodiment, a three-dimensional nano-structure array 10 is obtained as shown in FIG. 7.

Figure 8:
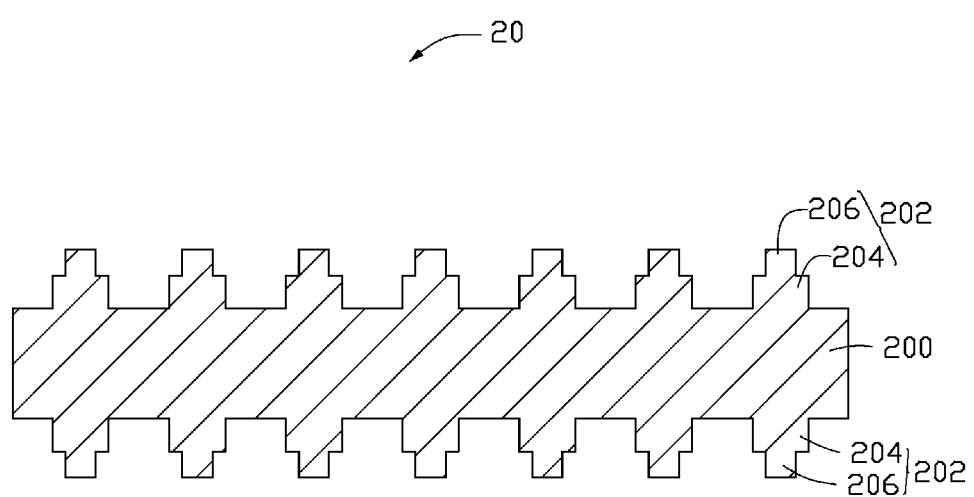
FIG. 8 is a schematic view of one embodiment of a three-dimensional nano-structure array.

Referring to FIG. 8, a three-dimensional nano-structure array 20 of one embodiment includes a substrate 200, and a number of three-dimensional nano-structures 202 located on two opposite surfaces of the substrate 200. The three-dimensional nano-structure 202 is a two-layer cylindrical structure including a first cylinder 204 and a second cylinder 206 located thereon. The three-dimensional nano-structure array 20 is similar to the three-dimensional nano-structure array 10 described above except that both the two opposite surfaces of the substrate 200 have a number of three-dimensional nanostructures 202 located thereon.

Figure 9:
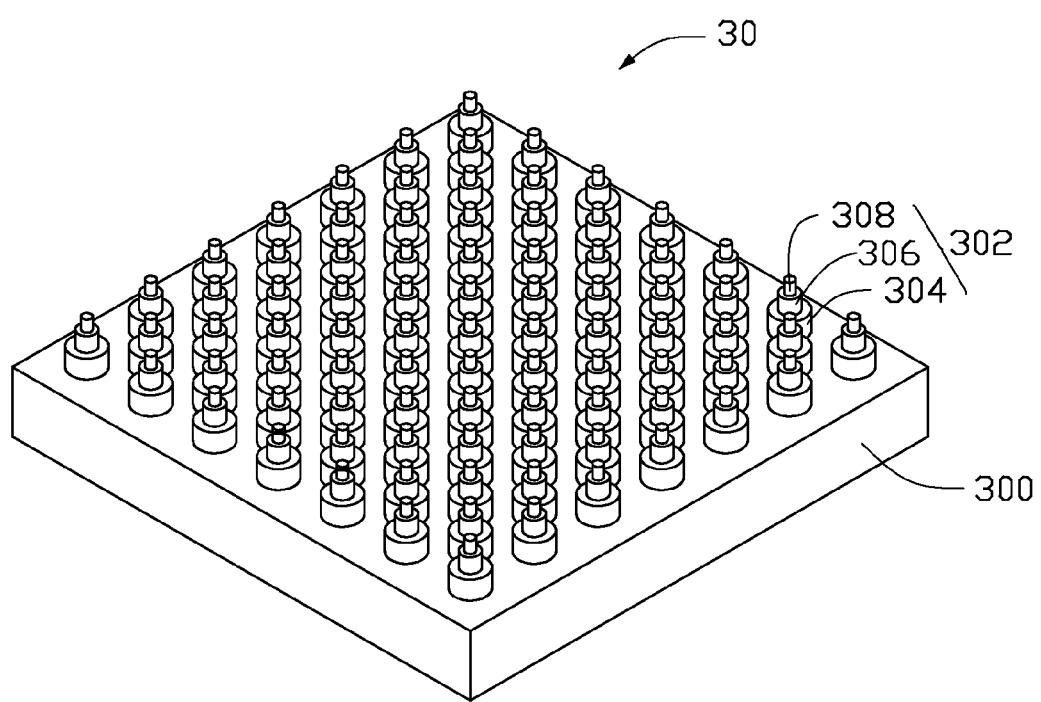
FIG. 9 is a schematic view of one embodiment of a three-dimensional nano-structure array.

Referring to FIG. 9, a three-dimensional nano-structure array 30 of one embodiment includes a substrate 300, and a number of three-dimensional nano-structures 302 located on a surface of the substrate 300. The three-dimensional nano-structure 302 is a three-layer cylindrical structure including a first cylinder 304, a second cylinder 306 located on the first cylinder 304, and a third cylinder 308 located on the second cylinder 306. The three-dimensional nano-structure array 30 is similar to the three-dimensional nano-structure array 10 described above except that each of the three-dimensional nano-structures 302 has a three-layer cylindrical structure.

Figure 10:
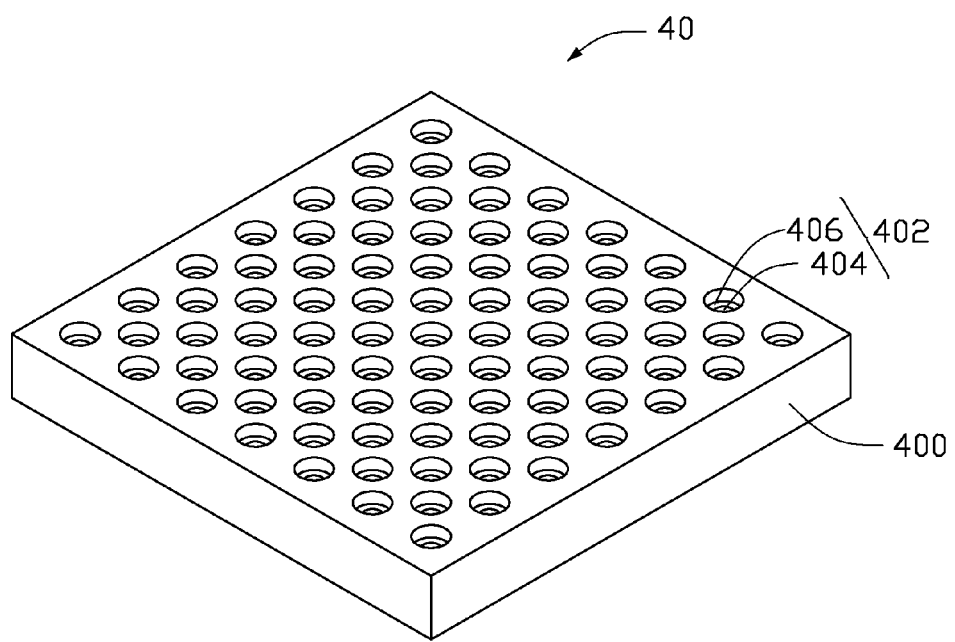
FIG. 10 is a schematic view of one embodiment of a three-dimensional nano-structure array.

Referring to FIG. 10, a three-dimensional nano-structure array 40 of one embodiment includes a substrate 400 and a number of three-dimensional nano-structures 402 defined in the substrate 400. The three-dimensional nano-structure array 40 is similar to the three-dimensional nano-structure array 10 described above except that the three-dimensional nano-structures 402 are inverted. Each three-dimensional nano-structure 402 is a blind hole caved in the substrate 400 from the surface of the substrate 400 and includes two communicating spaces. A stepped configuration is formed where the two communicating spaces join. The shape of the three-dimensional nano-structure 402 can be a multi-layer structure such as a multi-layer frustum of a prism, a multi-layer frustum of a cone, or a multi-layer cylinder. In one embodiment, the shape of the three-dimensional nano-structure 402 is a two-layer cylindrical structure including a first cylindrical space 404 and a second cylindrical space 406 substantially coaxially aligned with the first cylindrical space 404. The second cylindrical space 406 is adjacent to the surface of the substrate 400. The diameter of the second cylindrical space 406 is greater than the diameter of first cylindrical space 404. The first cylindrical spaces 404 can be considered a first nano-structure array and the second cylindrical spaces 406 could be considered another nano-structure array formed on top of the first nano-structure array.

A method for making a three-dimensional nano-structure array 40 of one embodiment includes the following steps of:
step H1, providing an substrate 400;
step H2, forming a mask defining a number of holes on a surface of the substrate 400;
step H3, simultaneously tailoring the mask and etching the substrate 400 by the mask; and
step H4, removing the mask.

In step H1, the substrate 400 is the same as the substrate 100 described above.

In step H2, the mask is a continuous film defining a number of holes arranged in the form of array. The mask can be made of polymer such as poly ethylene terephthalate (PET), polycarbonate (PC), polyethylene (PE), or polyimide (PI). The mask can be formed by nano-imprint or template deposition.

Step H3 can be the same as step (c) described above for simultaneously tailoring the mask and etching the substrate 400 by the mask. Because the reactive atmosphere can tailor the mask and simultaneously etch the substrate 400 by the mask, the holes become greater and the gap between the adjacent holes becomes smaller during the process. As the holes become larger, more of the substrate 400 can be etched. Thus, the three-dimensional nano-structures 402 with a stepped hollow are obtained.

In step H4, the mask can be removed by peeling.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a three-dimensional nano-structure array, the method comprising:
providing a substrate;
hydrophilicly treating the substrate;
forming a monolayer nanosphere array on the substrate, wherein the monolayer nanosphere array comprises a plurality of nanospheres;
placing the substrate with the monolayer nanosphere array thereon a reactive atmosphere, wherein the reactive atmosphere is produced by a microwave plasma system, the reactive atmosphere comprises chlorine gas, argon gas, and oxygen gas, an input rate of the chlorine gas is in a range from about 10 standard cubic centimeters per minute to about 60 standard cubic centimeters per minute, an input rate of the argon gas is in a range from about 4 standard cubic centimeters per minute to about 20 standard cubic centimeters per minute, and an input rate of the oxygen gas is in a range from about 4 standard cubic centimeters per minute to about 20 standard cubic centimeters per minute, a power of the plasma system is in a range from about 40 Watts to about 70 Watts, a working pressure of the reactive atmosphere is in a range from about 2 Pa to about 10 Pa, a tailoring and etching time in the reactive atmosphere is in a range from about 1 minute to about 2.5 minutes, and a ratio between a power of the plasma system and a working pressure of the reactive atmosphere is less than 20:1, thereby obtaining a plurality of stepped cylindrical bulges, each cylindrical bulge comprises a first cylinder and a second cylinder located on the first cylinder, a diameter of the first cylinder is greater than a diameter of the second cylinder; and
removing the monolayer nanosphere array.

2. The method of claim 1, wherein the reactive atmosphere simultaneously tailors the monolayer nanosphere array and etches the substrate using the monolayer nanosphere array as a mask.

3. The method of claim 2, wherein the plurality of nospheres becomes smaller and a gap between two adjacent nanospheres becomes a greater portion of the substrate is etched during the step of tailoring and etching.

4. The method of claim 1, wherein the second cylinder and the first cylinder are coaxial.

5. The method of claim 1, wherein the second cylinder extends substantially perpendicularly and upwardly from a surface of the first cylinder.

6. The method of claim 1, wherein a diameter of the first cylinder is in a range from about 30 nanometers to about 1000 nanometers, a height of the first cylinder is in a range from about 50 nanometers to about 1000 nanometers, a diameter of the second cylinder is in a range from about 10 nanometers to about 500 nanometers, a height of the second cylinder is in a range from about 20 nanometers to about 500 nanometers, and a distance between two adjacent first cylinders is in a range from about 10 nanometers to about 1000 nanometers.

7. The method of claim 1, wherein the plurality of stepped cylindrical bulges are arranged equidistantly.

8. The method of claim 1, wherein a distance between two adjacent stepped cylindrical bulges is in a range from about 0 nanometers to about 50 nanometers.

9. The method of claim 1, wherein the plurality of stepped cylindrical bulges is hexagonally arranged, squarely arranged, or concentrically arranged to form an array.

10. The method of claim 1, wherein the monolayer nanosphere array is formed by:
    preparing a nanosphere solution;
    forming a monolayer nanosphere solution on the substrate; and
    drying the monolayer nanosphere solution.

11. The method of claim 10, wherein the step of forming the monolayer nanosphere solution on the substrate comprises:
    diluting the nanosphere solution;
    inserting the substrate into the diluted nanosphere solution; and
    drawing the substrate out of the diluted nanosphere solution.

12. The method of claim 11, wherein an angle between the surface of the substrate and a level of the nanosphere solution is in a range from about 5 degrees to about 15 degrees.

13. The method of claim 11, wherein a speed of the inserting and drawing the substrate is in a range from about 3 millimeters per hour to about 10 millimeters per hour.

14. The method of claim 10, wherein the step of forming a monolayer nanosphere solution on the substrate comprises:
    diluting the nanosphere solution to form a diluted nanosphere solution;
    dripping the diluted nanosphere solution on the surface of the substrate;
    spinning the substrate at a speed from about 400 revolutions per minute to about 500 revolutions per minute for about 5 seconds to about 30 seconds;
    increasing, a spinning speed of the substrate to a range from about 800 revolutions per minute to about 1000 revolutions per minute for about 30 seconds to about 2 minutes; and
    increasing the spinning speed of the substrate to a range from about 1400 revolutions per minute to about 1500 revolutions per minute for about 10 seconds to about 20 seconds.

15. The method of claim 1, wherein the plurality of nanospheres is hexagonally close-packed, squarely close-packed, or concentrically close-packed.

16. The method of claim 1, wherein the mask is removed by being dissolved in a stripping agent selected from the group consisting of tetrahydrofuran, acetone, butanone, cyclohexane, hexane, methanol, and ethanol.

* * * * *